United States Patent
Blayvas et al.

(10) Patent No.: US 11,315,754 B2
(45) Date of Patent: Apr. 26, 2022

(54) ADAPTIVE GEOMETRY FOR OPTIMAL FOCUSED ION BEAM ETCHING

(71) Applicant: APPLIED MATERIALS ISRAEL LTD., Rehovot (IL)

(72) Inventors: Ilya Blayvas, Jerusalem (IL); Gal Bruner, Kibutz Kabri (IL); Yehuda Zur, Tel-Aviv (IL); Alexander Mairov, Herzlyiah (IL); Ron Davidescu, Gedera (IL); Kfir Dotan, Nes-Ziona (IL); Alon Litman, Nes-Ziona (IL)

(73) Assignee: APPLIED MATERIALS ISRAEL LTD., Rehovot (IL)

(*) Notice: Subject to any disclaimer, the term of this patent is extended or adjusted under 35 U.S.C. 154(b) by 0 days.

(21) Appl. No.: 16/859,974

(22) Filed: Apr. 27, 2020

(65) Prior Publication Data
US 2021/0335571 A1 Oct. 28, 2021

(51) Int. Cl.
*G01N 1/32* (2006.01)
*H01J 37/305* (2006.01)

(52) U.S. Cl.
CPC .............. *H01J 37/305* (2013.01); *G01N 1/32* (2013.01); *H01J 2237/24475* (2013.01)

(58) Field of Classification Search
CPC ........... H01J 2237/24475; H01J 37/305; H01J 37/304; H01J 37/3053; G01N 1/32
USPC ...................................................... 250/492.3
See application file for complete search history.

(56) References Cited

U.S. PATENT DOCUMENTS

| | | | |
|---|---|---|---|
| 5,541,411 A * | 7/1996 | Lindquist | H01J 37/28 250/307 |
| 5,616,921 A * | 4/1997 | Talbot | B23K 15/02 204/192.33 |
| 6,031,229 A * | 2/2000 | Keckley | H01J 37/304 204/192.33 |
| 6,188,072 B1 | 2/2001 | Chung | |
| 6,194,720 B1 | 2/2001 | Li et al. | |
| 6,211,527 B1 * | 4/2001 | Chandler | H01L 21/31116 250/492.2 |
| 6,670,610 B2 | 12/2003 | Shemesh et al. | |
| 8,426,830 B2 * | 4/2013 | Sato | H01J 37/222 250/492.1 |
| 8,709,269 B2 * | 4/2014 | Shemesh | G01N 1/32 250/492.1 |
| 2012/0085924 A1 | 4/2012 | Tomimatsu et al. | |

(Continued)

FOREIGN PATENT DOCUMENTS

KR  19990036438 A  5/1999

OTHER PUBLICATIONS

PCT/US2021/025093, "International Search Report and Written Opinion", dated Jul. 20, 2021, 9 pages.

(Continued)

*Primary Examiner* — Wyatt A Stoffa
(74) *Attorney, Agent, or Firm* — Kilpatrick Townsend & Stockton LLP

(57) ABSTRACT

A method of evaluating a region of a sample that includes alternating layers of different material. The method includes milling, with a focused ion beam, a portion of the sample that includes the alternating layers of different material; reducing the milling area; and repeating the milling and reducing steps multiple times during the delayering process until the process is complete.

18 Claims, 11 Drawing Sheets

(56) References Cited

U.S. PATENT DOCUMENTS

2012/0217152 A1\* 8/2012 Miller ................ H01J 37/1472
　　　　　　　　　　　　　　　　　　　　　　204/192.34
2020/0051777 A1\* 2/2020 Shneyour ............ H01J 37/3056
2021/0335571 A1\* 10/2021 Blayvas ................ H01J 37/305

OTHER PUBLICATIONS

Singh, et al., "Focused Ion Beam (FIB) Tomography of Nanoindentation Damage In Nanoscale Metal /Ceramic Multilayers", Materials Characterization. vol. 61, Jan. 2010, pp. 481-488.

\* cited by examiner

ADAPTIVE GEOMETRY FOR OPTIMAL FOCUSED ION BEAM ETCHING

BACKGROUND OF THE INVENTION

In the study of electronic materials and processes for fabricating such materials into an electronic structure, a specimen of the electronic structure can be used for microscopic examination for purposes of failure analysis and device validation. For instance, a specimen such as a silicon wafer that includes one or more electronic structures formed thereon can be milled and analyzed with a focused ion beam (FIB) to study specific characteristics of the structures formed on the wafer.

Many modern electronic structures include many different alternating layers of material in one or more portions of the structure. Removing one or more selected layers to analyze or study characteristics of a structure on the sample formed with the multiple layers is known as delayering and can be done with a FIB tool. As a delayering process is carried out, secondary electrons from the milled material are generated. The secondary electrons can be detected to analyze characteristics of the milled layers and the structure.

While FIB tools have been used in delayering in a variety of different structures, improvements in delayering techniques are desirable.

BRIEF SUMMARY OF THE INVENTION

Embodiments of the disclosure provide improved methods and a system for delayering structures. When standard FIB techniques are used to delayer a specimen, such as an electronic structure formed on a semiconductor wafer, that includes multiple alternating layers of different material. In order to control exact milling depth, it is important to know exactly what layer of the structure is currently exposed and undergoing milling. One of the clues that can be used to control the depth of milling is by measuring the Secondary Electrons (SE) emitted during the milling. As the process mills deeper into the specimen and through multiple sets of the alternating layers, it can become difficult and sometimes even impossible to accurately distinguish when a layer of a first material ends and an underlying layer of the second material begins.

Embodiments of the disclosure improve upon such standard techniques and enable a delayering process to accurately distinguish between the alternating layers even as a recess is milled deep into the sample. Embodiments can be beneficially employed whenever, during focused ion beam milling of a specimen, the alternating layers produce alternating yields of secondary electrons.

In some embodiments the improved noise ratio of the secondary ion signal is obtained by gradually and iteratively reducing the area milled in accordance with a pre-defined milling recipe. In other embodiments the improved noise ratio is obtained adaptively by feedback from the measured secondary ion signal to a noise ratio in the signal. In still other embodiments the improved noise ratio is obtained by counting the secondary electron signal when a generally flat area of the specimen is being milled and masking the signal when milling occurs outside of the generally flat region over non-flat sub-area. In still other embodiments the improved noise ratio is obtained by milling the specimen with an ion beam in which the current profile of the beam is pre-distorted to a degree inversely proportional to the expected milling rate of the undistorted uniform beam.

Some embodiments of the disclosure are particularly effective at delayering electronic structures formed on a semiconductor wafer that include multiple alternating layers of different materials, such as are found in modern 3D NAND flash memory devices as well as other semiconductor logic, memory and circuits as well as MEMS systems and other structures, but embodiments are not limited to such and can be useful in delayering any sample that has multiple sets of alternating layers of different materials.

Some embodiments pertain to a method of evaluating a region of a sample that includes alternating layers of different material. The method can include milling, with a focused ion beam, a portion of the sample that includes the alternating layers of different material; reducing the milling area; and repeating the milling and reducing steps multiple times during the delayering process until the process is complete.

Some embodiments pertain to a system for evaluating a region of a sample that includes alternating layers of different material. The system can include: a vacuum chamber; a sample support configured to hold a sample within the vacuum chamber during a sample evaluation process; a focused ion beam (FIB) column configured to direct a charged particle beam into the vacuum chamber; and a processor and a memory coupled to the processor. The memory can include a plurality of computer-readable instructions that, when executed by the processor, cause the system to: mill, with a focused ion beam, a portion of the sample that includes the alternating layers of different material; reduce the milling area; and repeat the milling and reducing steps multiple times during the delayering process until the process is complete.

Some embodiments pertain to a non-transitory computer-readable memory that stores instructions for evaluating a region of a sample includes alternating layers of different material by: milling, with a focused ion beam, a portion of the sample that includes the alternating layers of different material; reducing the milling area; and repeating the milling and reducing steps multiple times during the delayering process until the process is complete.

Various implementations of the embodiments described herein can include one or more of the following features. Secondary electrons from the alternating layers of different material can be collected throughout the milling process and used to determine an endpoint for the milling operation. Reducing the milling area can be done in accordance with a milling recipe defined in advance of the milling operation. Reducing the milling area can include reducing the milling area after every iteration of the milling process. Reducing the milling area can include reducing the milling area after every X iterations of the milling process where X is between 2 and 1000. The alternating layers of different material can include first and second layers that generate different numbers of secondary electrons when milled. The first layer can comprise a dielectric material and the second layer can comprise a metal. Reducing the milling area can be done adaptively by feedback from a signal-to-noise ratio of a signal representing secondary electrons generated during the milling process. The milling area can be reduced by reducing a scan pattern for the ion beam in both the X and Y directions. The sample can be a semiconductor wafer. The sample can include at least ten sets of alternating layers and the milling process can be an iterative process in which the focused ion beam is repeatedly scanned across the portion of the sample milling a recess through each of the ten sets of alternating layers.

Some embodiments pertain to a method of evaluating a region of a sample that includes alternating layers of different material the method including: milling, with a focused ion beam, a portion of the sample that includes the alternating layers of different material, wherein the milling is an iterative process in which the focused ion beam is repeatedly scanned across the portion of the sample thereby milling a recess into a depth of the sample, and wherein as the milling proceeds a sub-region of the portion of the sample remains generally flat; and during the milling process, measuring and integrating data generated by a secondary ion detector when the focused ion beam is scanned over the generally flat sub-region of the portion of the sample while ignoring data collected by the secondary ion detector when the focused ion beam is scanned over some regions of the portion of the sample outside the sub-region. According to some implementations, a geometry of the sub-region can be determined in advance of the milling. And, in some implementations, the size of the sub-region can be gradually decreased in size over multiple iterations of the milling according to a predetermined formula or in response to the data generated by the secondary ion detector to maintain a signal-to-noise ratio of the data within a predetermined range.

Still other embodiments pertain to a method of evaluating a region of a sample that includes alternating layers of different material where the method includes: milling, with a focused ion beam, a portion of the sample that includes the alternating layers of different material, wherein as the milling is an iterative process in which the focused ion beam is repeatedly scanned across the portion of the sample milling a recess into the depth of the sample, and wherein as the milling process proceeds curved edges develop at a bottom portion of the recess; and during the milling process, measuring and integrating data generated by a secondary ion detector when the focused ion beam is scanned over the generally flat region while ignoring data collected by the secondary ion detector when the focused ion beam is scanned over the curved region.

And, still further embodiments pertain to a method of evaluating a region of a sample that includes alternating layers of different material where the method includes: milling, with a focused ion beam, a portion of the sample that includes the alternating layers of different material, wherein as the milling is an iterative process in which the focused ion beam is repeatedly scanned across the portion of the sample milling a recess into the depth of the sample; and during the milling process, in regions at a periphery of the portion of the sample being milled, increasing a beam current of the milling to a level inversely proportional to an expected decrease of an etch rate at the periphery of the portion of the sample being milled as compared to an expected etch rate in a central region of the portion.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION OF THE INVENTION

Embodiments of the disclosure provide improved methods and a system for delayering structures. Standard FIB techniques used to delayer a specimen, such as an electronic structure formed on a semiconductor wafer, can be deficient when the specimen includes multiple alternating layers of different material. As a standard FIB process mills into a specimen, secondary electrons from the milled material are generated. The secondary electrons can be detected to analyze characteristics of the milled layers and the structure. In multi-layered structures that include multiple alternating layers of different materials, it can be difficult to accurately distinguish when a layer of a first material ends and an underlying layer of the second material begins. Embodiments of the disclosure improve upon such standard techniques and enable a delayering process to accurately distinguish between the alternating layers even as a recess is milled deep into the sample through multiple sets of the alternating layers.

Figure 1:
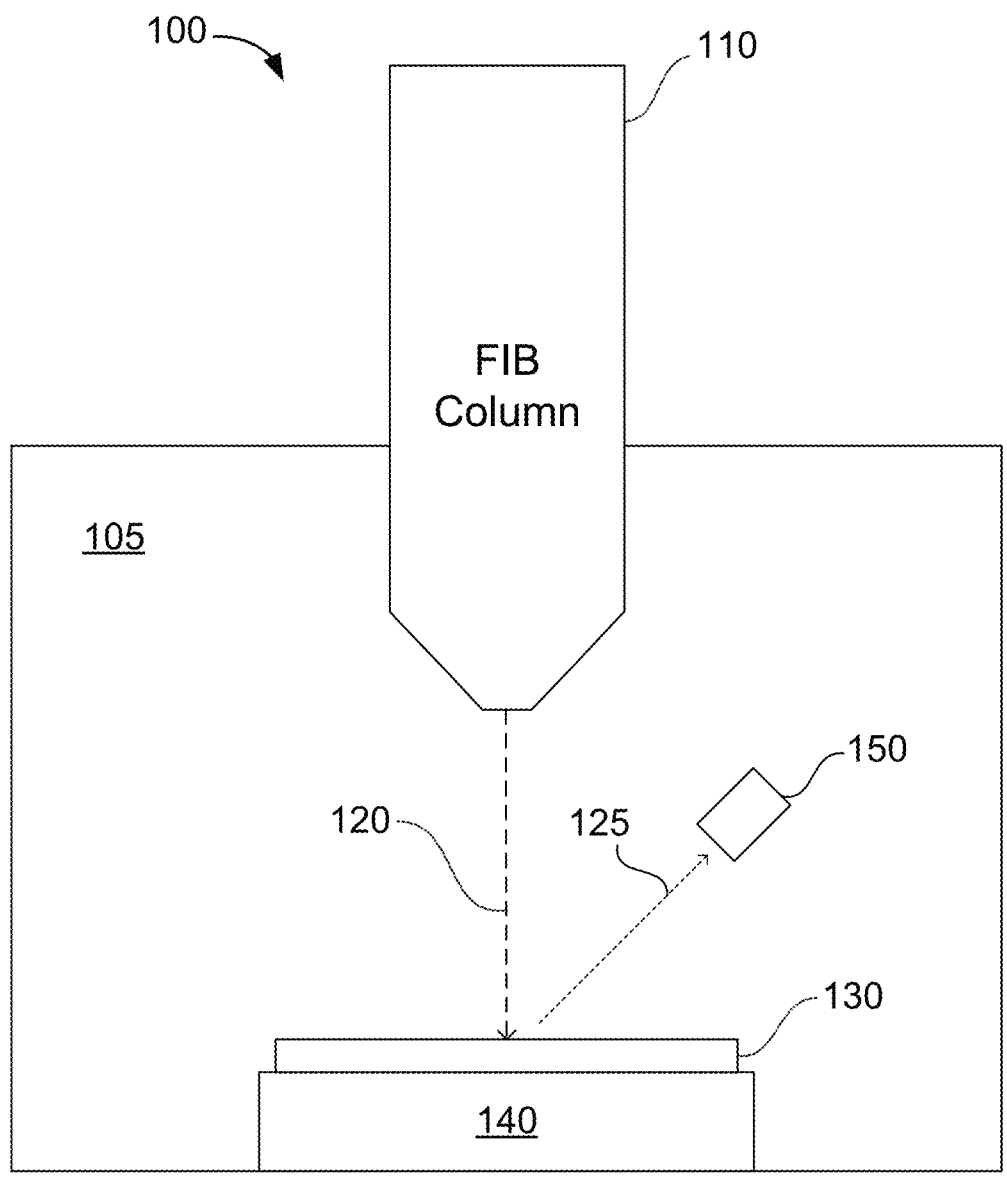
FIG. 1 is simplified illustration of a sample focused ion beam (FIB) evaluation system according to some embodiments of the disclosure.

In order to better understand and appreciate the disclosure, reference is first made to FIG. 1, which is a simplified schematic illustration of a focused ion beam (FIB) evaluation system 100 according to some embodiments of the disclosure. As shown in FIG. 1, system 100 can include, among other elements, a focused ion beam (FIB) column 110, a sample supporting element 140 and a secondary electron detector 150. FIB column 110 is operable to generate a collimated charged particle beam 120 and direct the particle beam towards a sample 130 (sometimes referred to herein as an "object" or a "specimen") to mill or otherwise process the sample. The sample, for example a semiconductor wafer, can be supported on a supporting element 140 within a vacuum chamber 105.

FIB column 110 can mill (e.g., drill a recess in) sample 130 by irradiating the sample with charged particle beam 120 to form a cross section and, if desired, can also smooth the cross section. An FIB milling process typically operates by positioning the specimen in a vacuum environment and emitting a focused beam of ions towards the specimen to etch or mill away material on the specimen. In some instances the vacuum environment can be purged by controlled concentration of background gases that serve to help control the etch speed and quality or help control matter deposition. The accelerated ions can be generated from Xenon, Gallium or other appropriate elements and are typically accelerated towards the specimen by voltages in the range from 500 volts to 100,000 volts, and more typically falling in the range from 5,000 volts to 50,000 volts. The beam current is typically in the range from several pico amps to several micro amps, depending on the FIB instrument configuration and the application, and the pressure is typically controlled between $10^{-10}$ to $10^{-5}$ mbar in different parts of the system and in different operation modes.

A delayering process can be done by: (i) locating a location of interest that should be milled in order to remove a certain thickness of material from the sample, (ii) moving the sample (e.g., by a mechanical supporting element) so that the sample is located under the field-of-view of the FIB unit, and (iii) milling the sample to remove a desired amount of material in the location of interest. The delayering process can include forming a recess in the sample (usually sized a few microns to few tens of microns in lateral and vertical dimensions).

The milling process typically includes scanning a charged particle beam back-and-forth (e.g., in a raster scan pattern) at a constant rate across a particular area of the sample being imaged or milled. One or more lenses (not shown) coupled to the charged particle column can implement the scan pattern as is known to those of skill in the art. The area scanned is typically a very small fraction of the overall area of sample. For example, the sample can be a semiconductor wafer with a diameter of either 200 or 300 mm while each area scanned on the wafer can be a rectangular area having a width and/or length measured in microns or tens of microns.

During a milling operation the charged particle beam 120 generated by FIB column 110 propagates through the vacuumed environment formed within vacuum chamber 105 before impinging on sample 130. Secondary ions 125 are generated in the collision of ions with the sample and detected by secondary ion detector 150. The detected secondary electrons can be used to analyze characteristics of the milled layers and the structure.

While not shown in FIG. 1, FIB evaluation system 100 can include a number of additional components including, but not limited to, one or more gas nozzles to deliver process gases to chamber 105, vacuum and other valves to control the pressure within chamber 105, and one or more lenses to direct the charged particle beam among other components. System 100 can also include one or more controllers, processors or other hardware units that control the operation of system 100 by executing computer instructions stored in one or more computer-readable memories as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

Figure 2A:
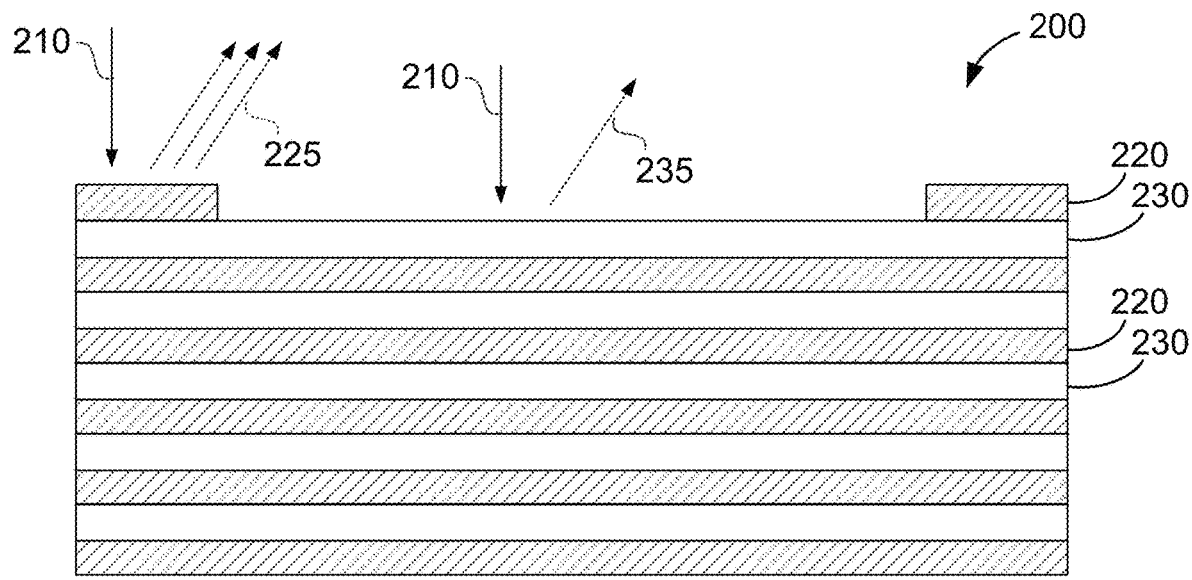
FIG. 2A is a simplified cross-sectional illustration of a semiconductor wafer having multiple alternating layers of two different materials formed on the wafer.
Figure 2B:
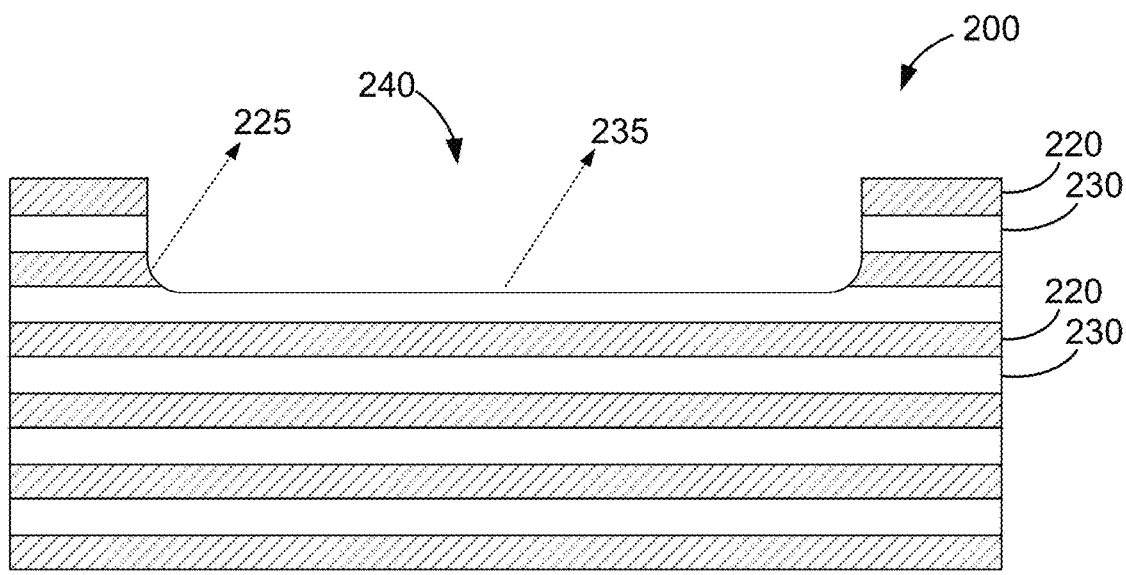
FIGS. 2B-2D are simplified cross-sectional illustrations of the semiconductor wafer shown in FIG. 2A at different stages of a delayering process.
Figure 2C:
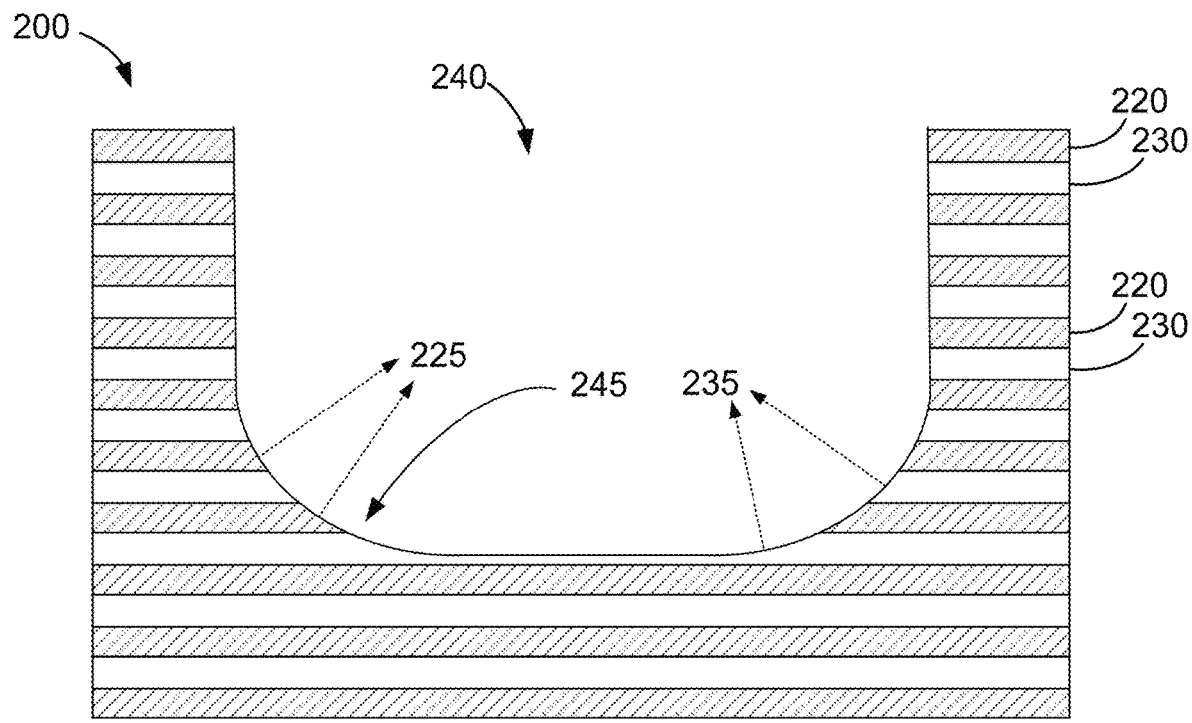
Figure 2D:
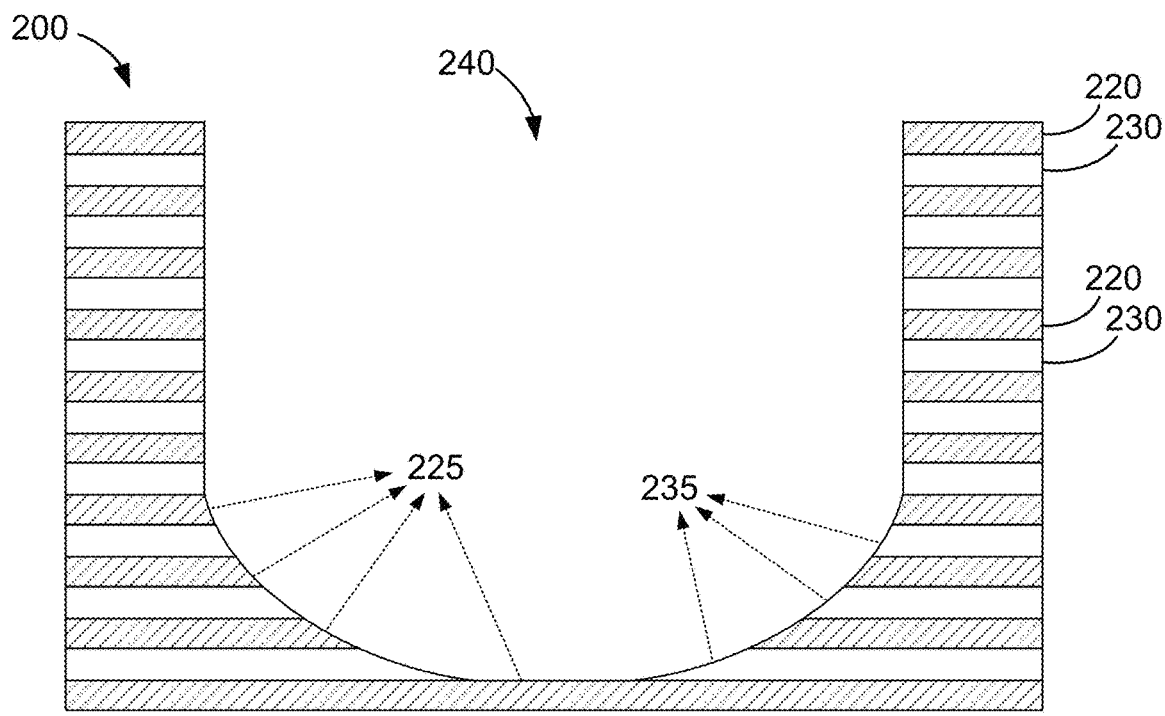

Reference is now made to FIGS. 2A-2D where FIG. 2A is a simplified cross-sectional illustration of a sample semiconductor wafer 200 and FIGS. 2B-2D are simplified cross-sectional illustrations of semiconductor wafer 200 at different stages of a delayering process. Sample 200 includes multiple sets of alternating layers 220, 230. Specifically, five sets of alternating layers are depicted in FIGS. 2A and 2B and nine sets are depicted in FIGS. 2C and 2D but it is understood that sample 200 can have any reasonable number of sets of the alternating layers and in many instances will have 20 or more sets of layers 220, 230.

Layer 220 and layer 230 differ in their chemical composition and each has different yields of secondary electrons when milled with a focused ion beam, such as charged particle beam 120. As non-limiting list of examples according to various embodiments of the disclosure can include alternating layers of silicon oxide and silicon nitride, or polysilicon and silicon oxide or any appropriate structure formed from other two or more alternating materials having different yields of secondary electrons, such as polysilicon, silicon oxide, silicon nitride, aluminum oxide, or other oxides or composite materials, aluminum, tungsten, copper, gold, platinum or other metals or alloys or composites featuring metals, photoresist materials, or any other materials that are currently used or will be used in the industry for manufacturing or research. In some embodiments, each layer 220 can be a dielectric material and each layer 230 can be an electrically conductive material, and in some embodiments one or more of the layers 220 and 230 can include a thin adhesion layer or a thin barrier layer.

Embodiments of the disclosure are not limited to any particular materials for either layer 220 or 230 as long as the two alternating layers each include materials that differ in their chemical composition and produce different amounts of secondary electrons during the milling process. For example, FIG. 2A schematically depicts that when sample 200 is milled with an ion beam 210, a greater number of secondary electrons 225 are generated from layer 220 of a first type of material than the number of secondary electrons 235 generated from milling layer 230 of a second, different type of material. Because layer 220 of the first type of material generates more secondary electrons when milled than layer 230 of the second type of material, an output signal generated by secondary detector 150 can be used to distinguish when layer 220 is being milled as compared to when layer 230 is being milled.

Referring now to FIG. 2B, during the initial portion of a delayering process the delayered portion is relatively shallow and the surface of the recess 240 milled in substrate 200 is generally flat. At this point of the milling process, the signal from one layer dominates the signal from the other layer and it is relatively easy to detect when the milling process transitions from milling layer 320 into milling layer 330 or vice-versa.

As the milling process proceeds and mills a recess deeper into sample 200, the profile of the recess starts to change due to the etching characteristics of the milling process. Specifically, rounded edges 245 begin to develop in the bottom portion of milled area 240. The rounded edges 245 result in simultaneous etching of regions from both of layers 220 and 230, which in turn results in secondary electrons 225 and 235 from the different layers being simultaneously generated and interfering with each other.

Eventually, as when the milling process reaches a point as depicted in FIG. 2D, the signals from the different layers are sufficiently mixed that the signal generated by secondary electron detector is sufficiently noisy that it becomes difficult or even impossible to detect which layer is currently being milled at the bottom of the recess.

Figure 3:
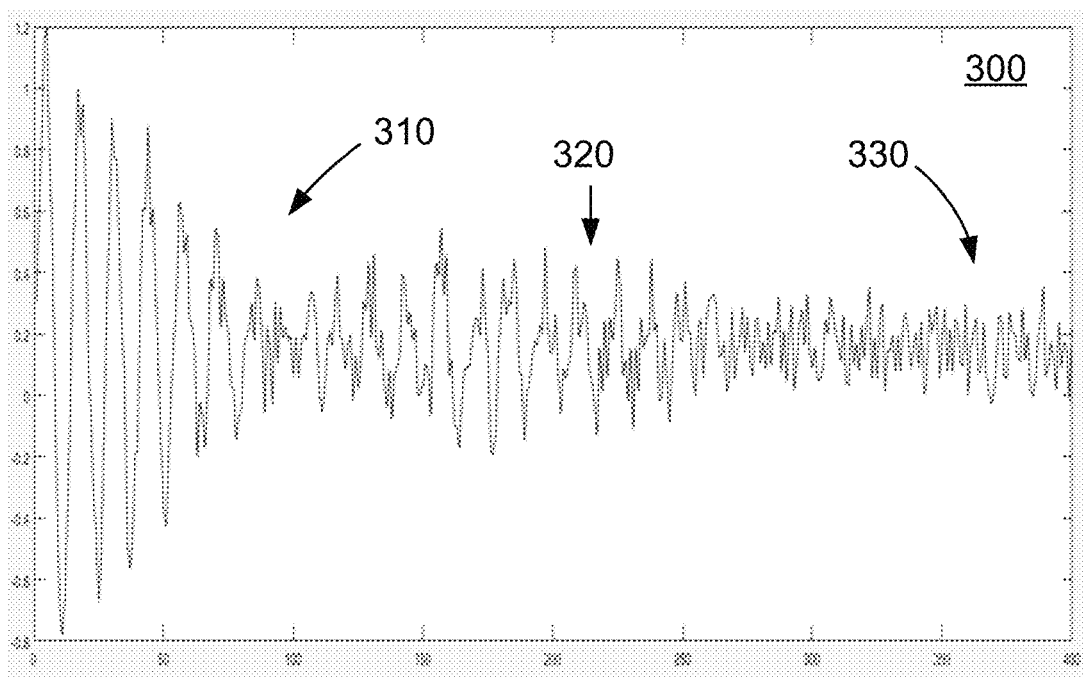
FIG. 3 is a graph depicting secondary electrons detected over time as the semiconductor wafer shown in FIGS. 2B-2D is subject to a delayering process.

FIG. 3 is a graph depicting a signal 300 generated by secondary electron detector during the milling process depicted in FIGS. 2B-2D. In FIG. 3, the X-axis depicts time which is directly related to milling depth and the Y-axis depicts signal strength. As can be seen in FIG. 3, at the beginning of the milling process (area 310), each of the layers 220, 230 have strong contributions to the signal that are readily identifiable. As the milling process continues and the depth of the recess milled changes from the recess shown in FIG. 2B to the recess shown in FIG. 2C, signal 300 starts to degrade (area 320) but it is still readily easy to detect when the milling process transitions from one of layers 220, 230 to the other. Then, as the milling process drills deeper into the sample signal 300 eventually degrades to an unintelligible signal (area 330) from which it cannot be readily determined whether the milling process is milling one of layers 220 or one of layers 230.

Figure 4:
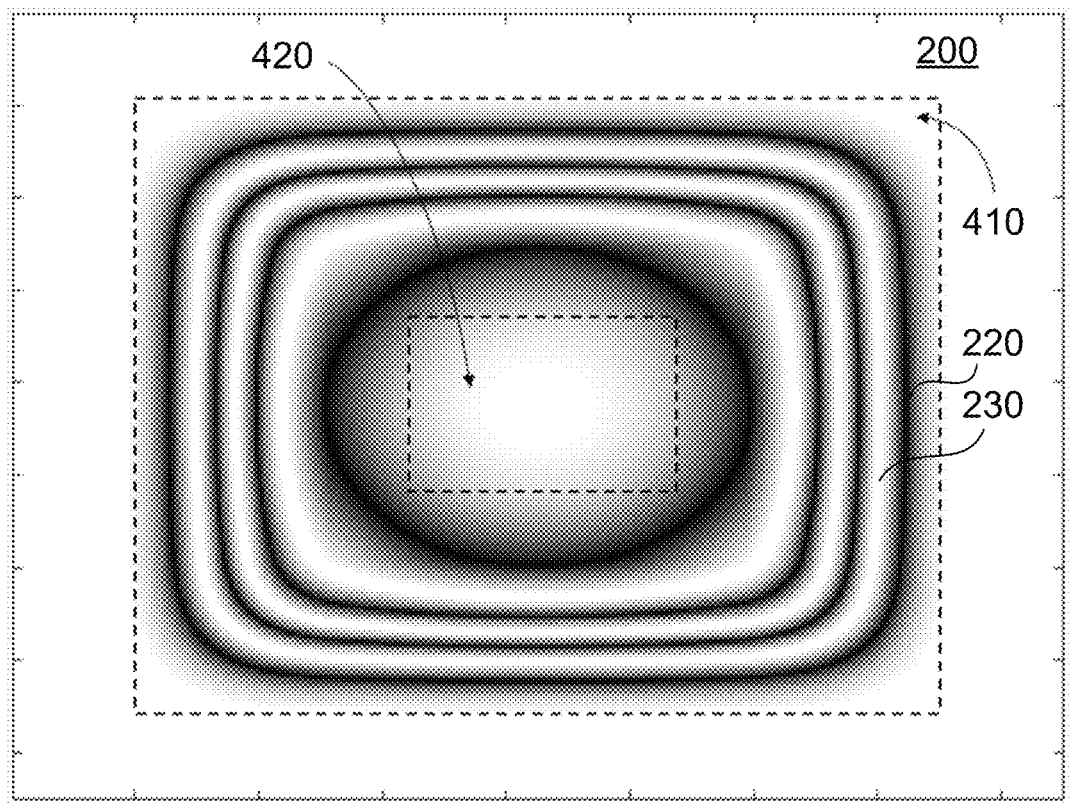
FIG. 4 is a simplified top view the semiconductor wafer shown in FIG. 2A after a recess has been partially milled into the wafer.

Due to the curved nature of the bottom edges of recess 240, the recess can start to take a the shape of a bowl when viewed from the top. FIG. 4 is a simplified top view of sample 200 in the area 410 of the sample where recess 240 is milled. As shown in FIG. 4, layers 220, 230 are partially visible in the area of recess 240 where the bottom edges of the recess are curved. A relatively flat portion 420 is in the center of the milled recess and represents a surface of the recess in which only one of the two layers is exposed.

Embodiments of the disclosure provide an improved method of delaying a sample and system for the same in which the secondary ion signal remains strong throughout the milling process even as the recess is milled deep into the sample. Thus, embodiments of the disclosure enable the delayering process to distinguish between the different types of alternating materials, such as in layers 220 and 230, even as a recess is milled very deep into the sample.

In some embodiments, an adaptive geometry technique is employed where the scan pattern for the FIB gradually changes by getting smaller as the recess is etched deeper and deeper into the sample. In such embodiments, the FIB mills only a relatively flat sub-region in each iteration (e.g., region 420) and therefore predominantly one of the layers 220, 230 is exposed to the ion beam each iteration producing secondary ions that are mostly or exclusively from the exposed layer.

Figure 5:
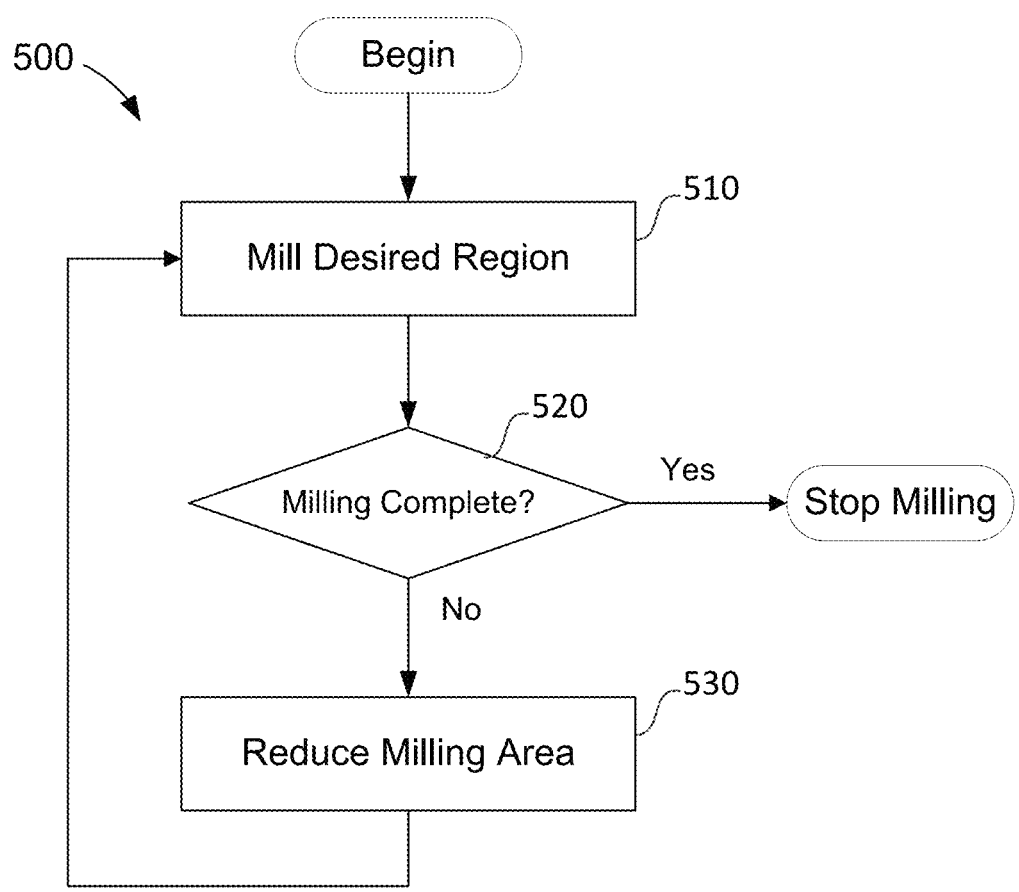
FIG. 5 is a flowchart depicting steps associated with a delayering process according to some embodiments of the disclosure.

FIG. 5 is a flowchart depicting steps of an adaptive geometry milling method 500 according to some embodiments of the disclosure. As shown in FIG. 5 method 500 includes milling a desired region (block 510) and iteratively reducing the milling area (block 520) until the milling process is complete. During the milling process secondary electrons can be continuously collected and used to both analyze the portion of the sample being milled and to determine an endpoint for the milling process.

Each iteration of a milling process can include scanning the ion beam back-and-forth across the milling area at a constant rate in a raster scan pattern. Thus, the scan pattern, which can be stored in a memory coupled to FIB system 100, becomes continuously smaller as a recess is milled deeper and deeper into the sample. A single iteration removes a very thin layer of material of the sample—sometimes a single atomic layer or less is removed in each iteration. In typical electronic structures, the thickness of alternating layers 220, 230 of the structure can vary from a single atomic layer to several micrometers. Thus, it can take from one to thousands of iterations of the scans to delayer each of the individual layers 220, 230.

Figure 6A:
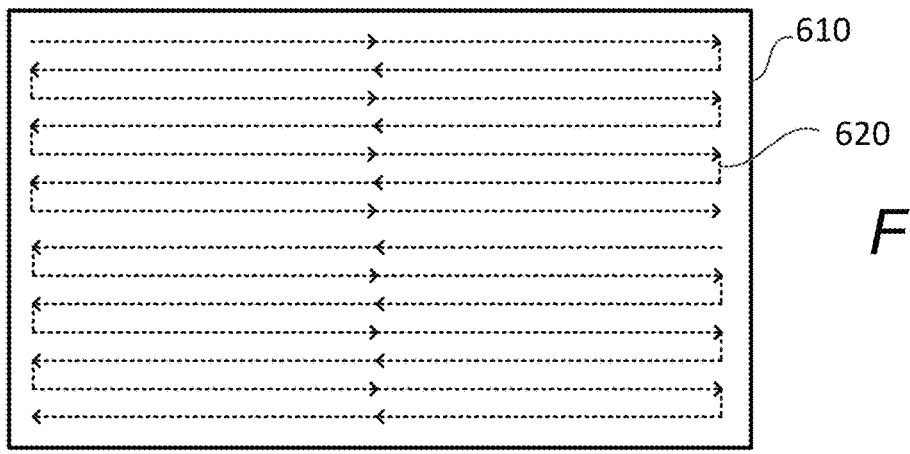
FIGS. 6A-6C are simplified illustrations of a scan pattern used to mill a recess in a specimen according to some embodiments of the disclosure.
Figure 6B:
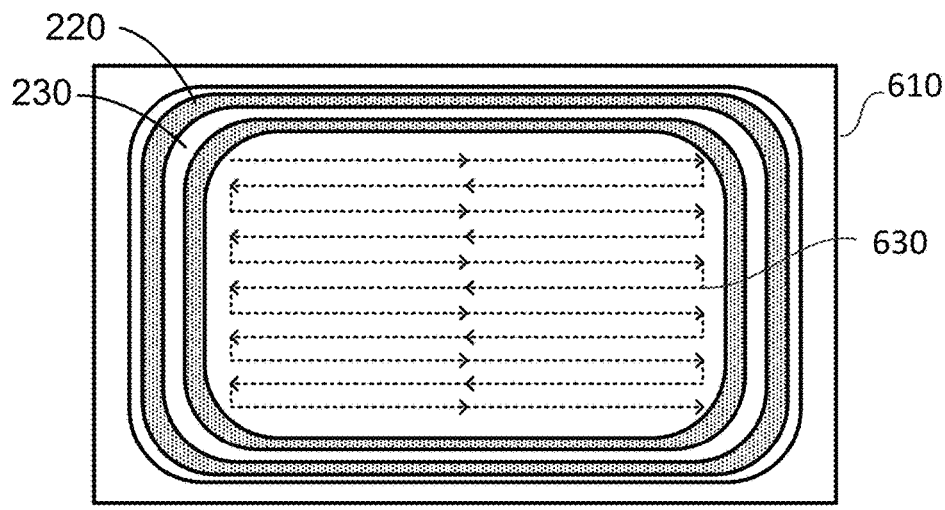
Figure 6C:
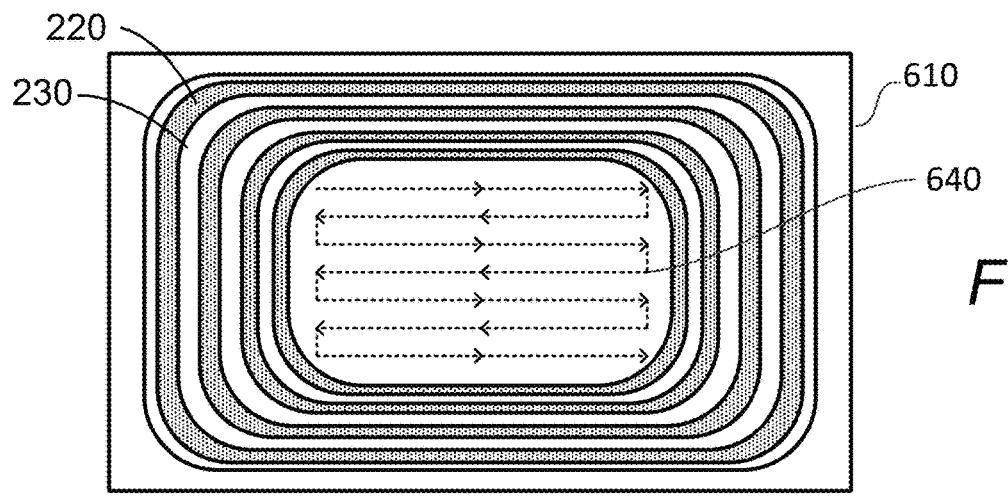

FIGS. 6A-6C are simplified illustrations that depict a shrinking scan pattern according to some embodiments. As shown in FIG. 6A, at an early stage of a milling process that mills a recess in an area 610 of a sample, a scan pattern 620 can cover essentially the entire surface area of area 610. Later in the process, (e.g., after thousands of iterations) the scan pattern can have gradually been reduced in size to pattern 630 shown in FIG. 6B. Then, near the end of the process (e.g., after thousands of additional iterations), a final scan pattern can be reduced even further to pattern 640.

Figure 7A:
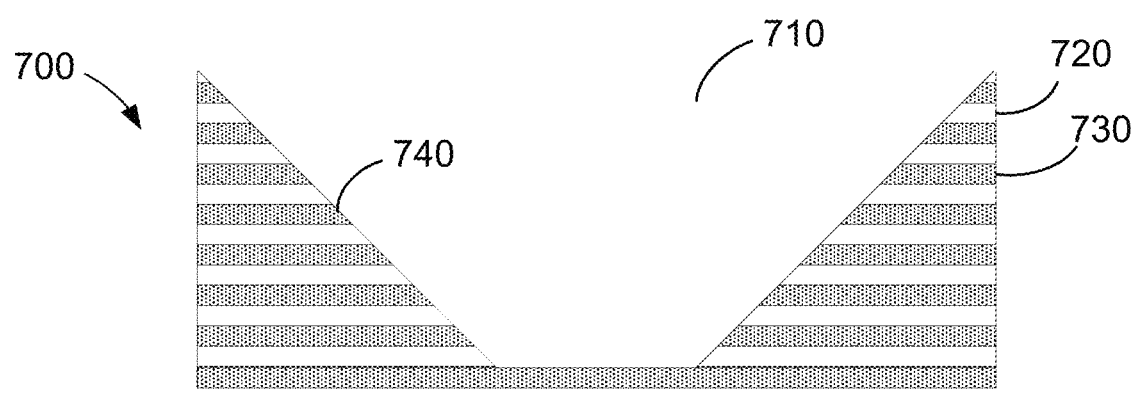
FIGS. 7A and 7B are simplified cross-sectional illustrations of recesses milled in a specimen according some embodiments of the disclosure.

In some embodiments, the milling area can be reduced in method 500 each and every iteration resulting in a generally smooth profile along the sidewalls of the milled recess. FIG. 7A is a simplified cross-sectional view of a sample 700 having a recess 710 milled according to such a technique. As shown in FIG. 7A, recess 700 is milled through multiple alternating layers 720, 730 of different materials creating a smooth sidewall 740 within recess 710 across a particular area of the sample being milled.

Figure 7B:
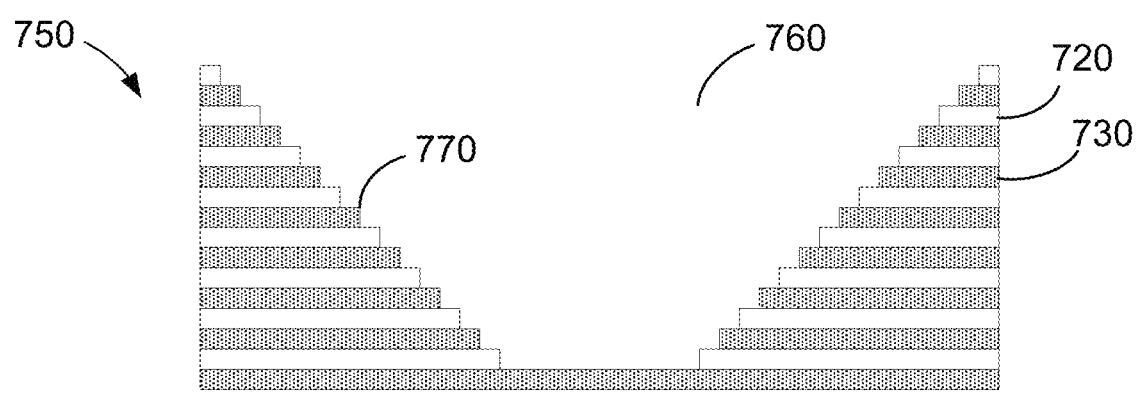

In other embodiments, the milling area can be reduced in method 500 after a predetermined number of iterations, such as after every 10 iterations or every 50 iterations. In some embodiment the predetermined number of iterations can be anywhere between 2-1000. In still other embodiments, the milling area can be reduced after milling through each layer. FIG. 7B is a simplified cross-sectional view of a sample 750 having a recess 760 milled according to such a technique. Similar to sample 700, sample 750 includes multiple sets of alternating layers 720, 730 made of different materials. When the first layer of material 720 is milled, the milling area of each iteration remains the same until the milling process mills through the bottom of the first layer of material 720 and reaches the first layer of material 730. The milling area is then reduced and the first layer of material 730 is milled according to this reduced milling area scan pattern until the milling process mills through the bottom of the first layer of material 730 and reaches the second layer of material 720. The process can continue in this manner, reducing the milling area upon reaching each next successive layer until the milled recess 760 is complete. Recess 760 formed in this manner can exhibit a sidewall 770 that exhibits a stepped profile as shown in FIG. 7B.

Figure 8:
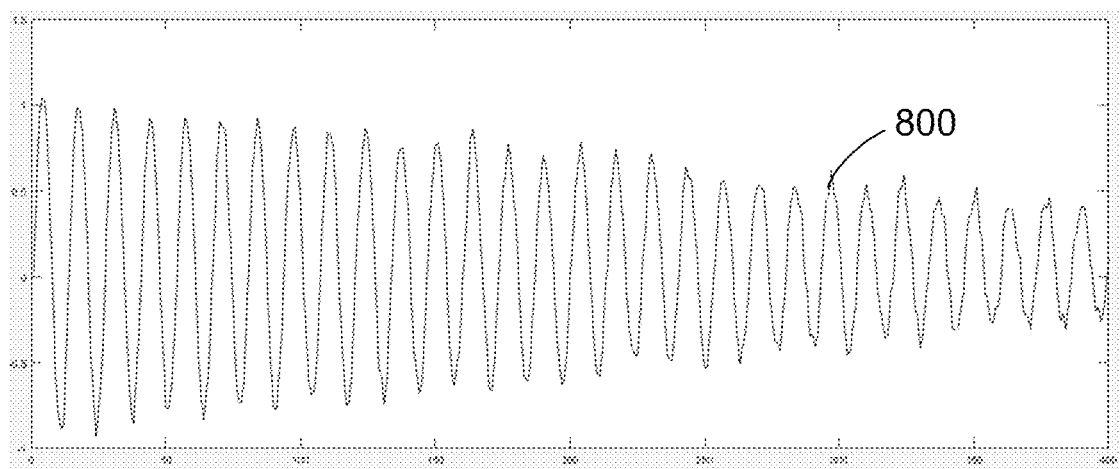
FIG. 8 is a graph depicting secondary electrons detected over time as the semiconductor wafer is subject to a delayering process according to some embodiments of the disclosure.

FIG. 8 is a graph depicting a signal 800 generated by a secondary electron detector during a milling process in accordance with process 500 depicted in FIG. 5 according to some embodiments. In FIG. 8, the X-axis depicts time which is directly related to milling depth and the Y-axis depicts signal strength. As can be seen in FIG. 8, which can be contrasted to FIG. 3, while the strength of signal 800 decreases over time, the different layers of the sample (e.g., layers 720, 730) each exhibit strong contributions to the signal that are readily identifiable throughout the entire milling process.

Figure 9:
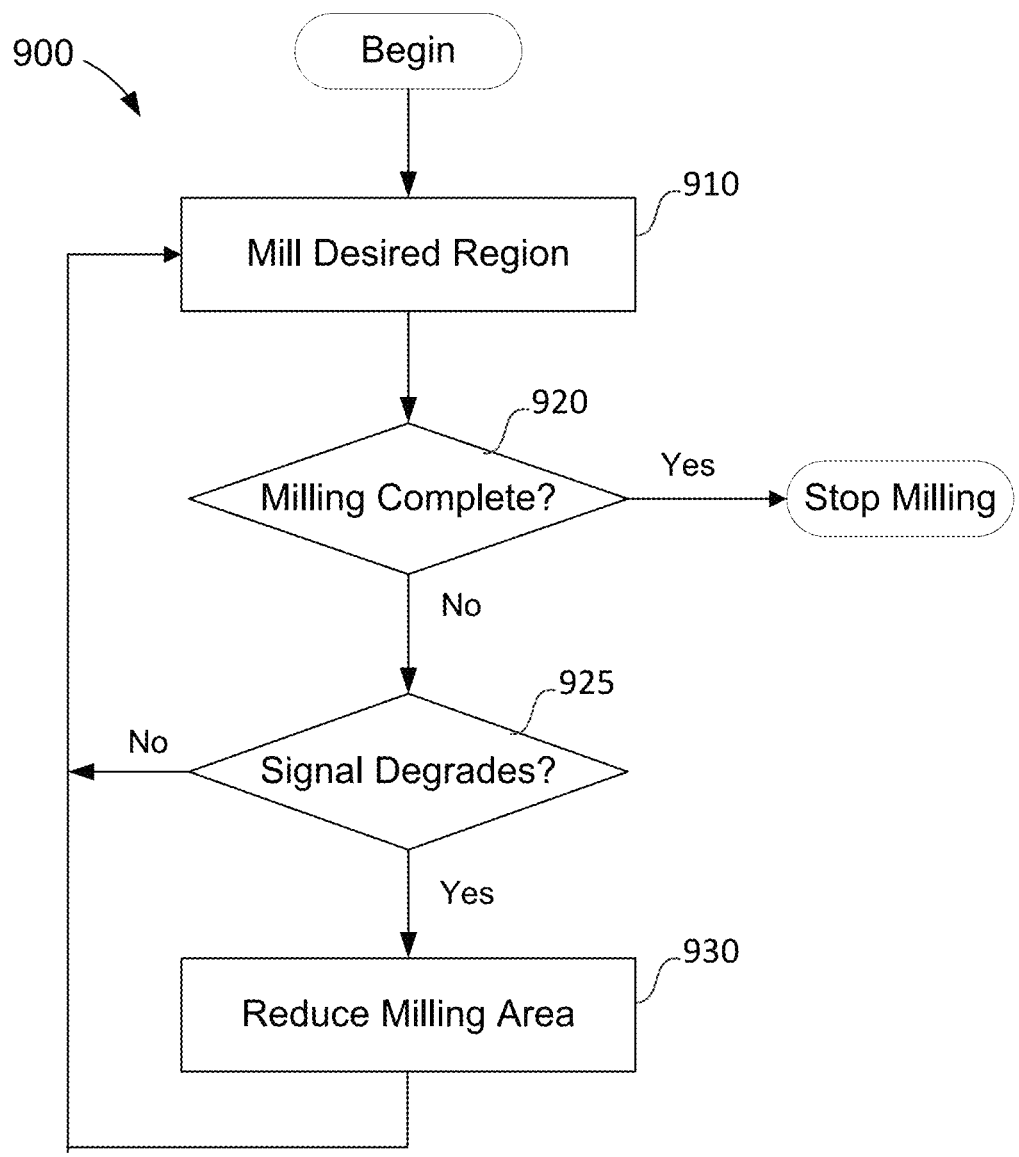
FIG. 9 is a flowchart depicting steps associated with a delayering process according to some embodiments of the disclosure.

FIG. 9 is a flowchart depicting steps of an adaptive geometry milling method 900 according to some additional embodiments of the disclosure. Method 900 is similar to method 500 in that the area milled can be reduced over time. Instead of reducing the area every iteration, every X iterations or after delayering each individual layer as done in method 500, method 900 continuously monitors the quality of the secondary ion signal (e.g., signal 300 and signal 800) and determines when to reduce the milling area based on this signal. For example, in some embodiments method 900 reduces the milling area (block 930) only after it detects (block 925) that the signal quality has degraded to a point where it is difficult to detect which layer is being milled. In other embodiments, method 900 can reduce the milling area once it detects (block 925) that the signal quality has degraded to a previously determined noise level. In either embodiment, once signal degradation exceeds a pre-determined threshold level, the milled area can be reduced and milling can continue (block 910) until completion or until the signal degrades again in which case the milling area can be reduced again.

As shown in FIG. 8, the secondary ion signal can be an alternating signal characterized by its peak and valley values, or alternating local extremum values. The ratio between the values defines the basic signal to noise level, assuming a stationary level of additive noise. Embodiments of the disclosure can employ an algorithm that samples the signal, and compares its adjacent local maximum and minimum levels, corresponding to passing through two adjacent layers. For an initial clear signal there will be a certain ratio between adjacent maximum and minimal signals. Embodiments of the disclosure can set a threshold value for this ratio in an algorithm configuration file stored in a computer-readable memory. Embodiments can then, at the moment when the ratio falls below the threshold value, reduce the milling area by a certain factor to increase the ratio. The newly adjusted area (i.e., the reduced milling area) can then be maintained until the ratio falls again below the threshold value.

In additional embodiments, the scan pattern can remain unchanged throughout the milling process and instead the signal generated by the secondary ion detector can be measured and integrated only during periods of the milling process when the ion beam is scanned over the relatively flat sub-region that represents the bottom of the recess being milled within the larger milled area. In this manner, the signal used to analyze characteristics of materials within the milled recess (e.g., signal 300) only represents portions of the milling process where the milling is performed over an exposed portion of one of the layers 220, 230 (e.g., area 420) and not when milling is performed over the curved portions of the recess is not degraded over time.

Figure 10:
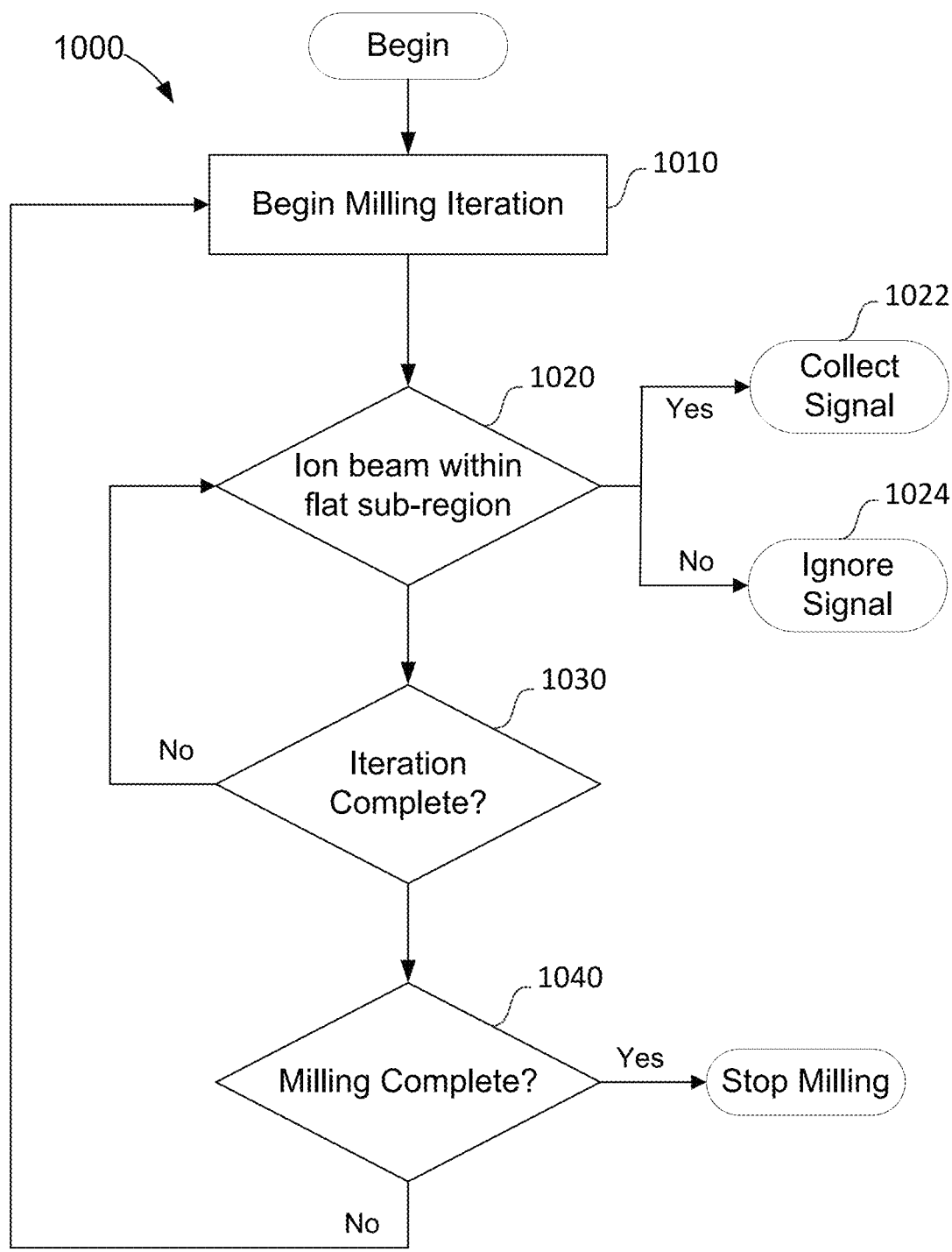
FIG. 10 is a simplified flowchart depicting the steps associated with a method of delaying a sample according to some embodiments of the disclosure.
Figure 11:
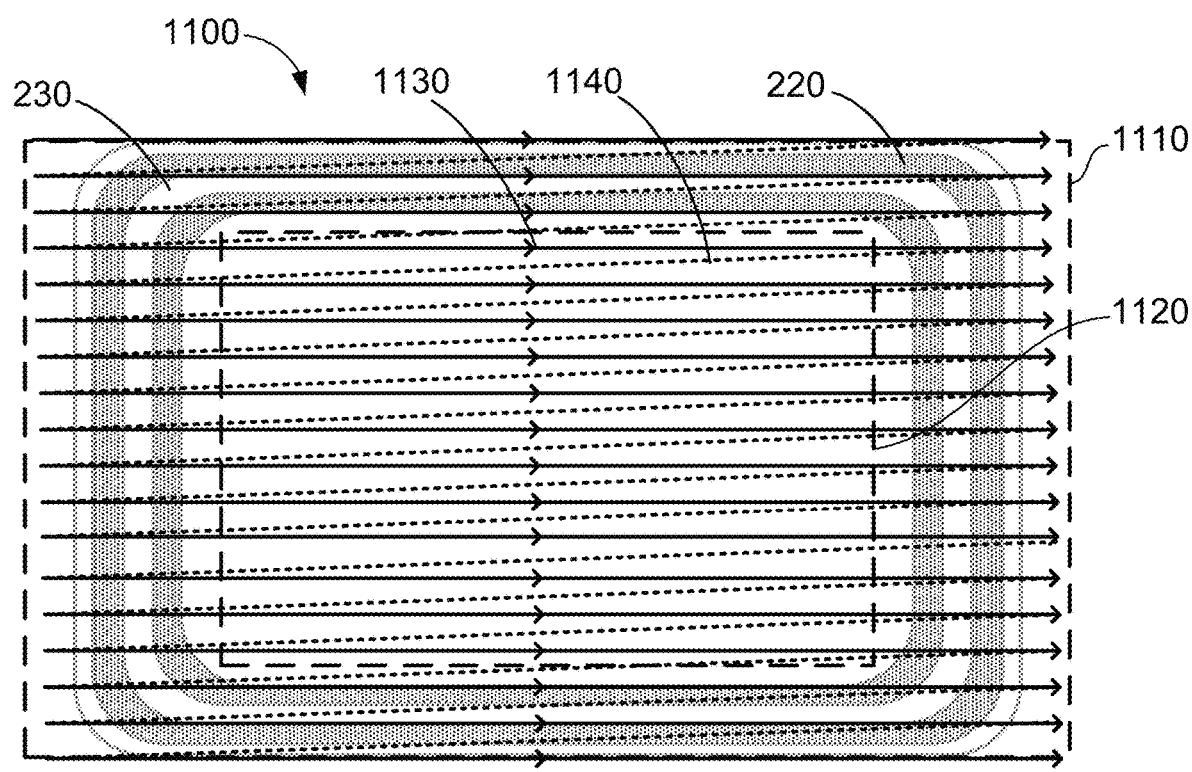
FIG. 11 is a simplified illustration of a scan pattern that can implemented according to the method of FIG. 10 where the scan pattern is superimposed over a top view of a portion of an electronic structure formed on a semiconductor wafer after a recess has been partially milled into the wafer.
Figure 12:
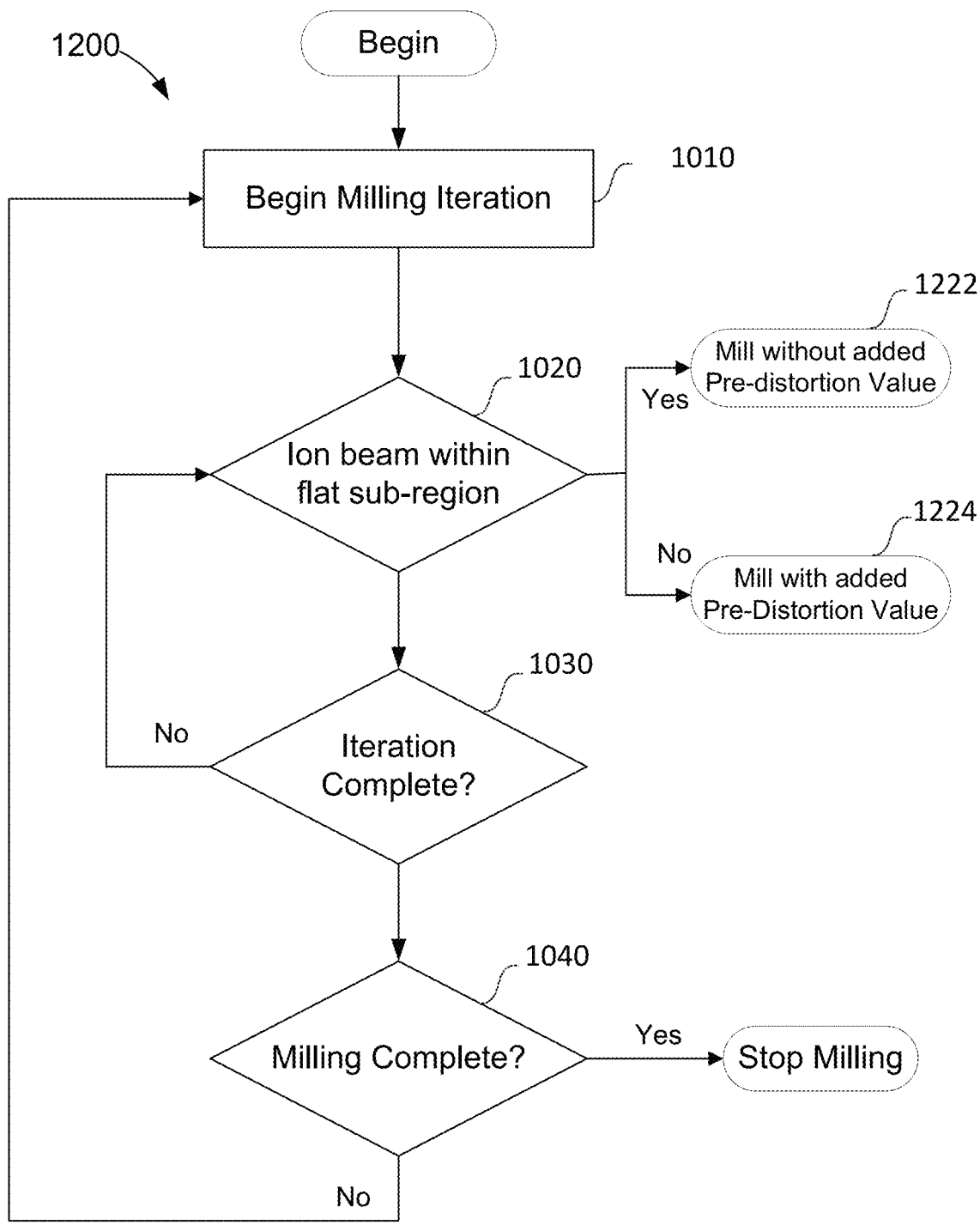
FIG. 12 is a simplified flowchart depicting the steps associated with a method of delaying a sample according to some embodiments of the disclosure.

To further explain, reference is made to FIGS. 10 and 11. FIG. 10 is a simplified flowchart depicting the steps associated with a method 1000 of delaying a sample according to some embodiments and FIG. 11 is a simplified top view of a portion of an electronic structure 1100 formed on a semiconductor wafer after a recess has been partially milled into the wafer similar to the view shown in FIG. 4. As shown in FIG. 10, method 1000 is an iterative process similar to methods 500 and 900. For each iteration of the milling process, however, method 1000 monitors whether the ion beam is directed towards the sample and over a generally flat sub-region of the sample (block 1020).

For example, referring to FIG. 11 an area 1110 is shown in dashed lines that has already been milled through several different layers of alternating materials 220, 230. A sub-region 1120 (also represented in dashed lines) is present at the bottom of the milled recess and has a top surface in which a layer made from material 220 is exposed. Also shown in FIG. 11 is a scan pattern where the FIB tool is operated in a forward mode (indicated by lines 1130) but not operating in backward mode (indicated by dotted lines 1140). That is, the sample is bombarded with an ion beam as the beam is moved from the left to the right within area 1110 and bombardment is paused as the field-of-view of the ion beam is moved back to start the next scan operation.

During each iteration of the scan pattern (blocks 1010, 1020, 1030), embodiments in accordance with method 1000 ignore (mask) the signal generated by the secondary electron detector when the ion beam is outside of sub-region 1120 (block 1024) and only measure and integrate the signal when the ion beam is within sub-region 1120 (block 1022). Then, when an iteration is complete, a next iteration starts (block 1040, milling complete=no) and the cycle repeats until the entirety of the recess is milled (block 1040, complete=yes). In this manner, method 1000 essentially ignores portions of the signal that would otherwise be generated when the ion beam is over a curved bottom edge of the recess such as curved region 245 shown in FIG. 2C.

In still another embodiment, a method 1200 according to the disclosure measures and integrates the secondary ion signal as the ion beam is scanned across the entire region 1110 but the processing circuitry of the FIB evaluation tool adds a pre-distortion value to the signal that is inversely proportional to the expected milling profile. Thus, in regions closer to the periphery, where the etch rate is normally slower, the beam current can be increased inversely proportionally to the expected decrease of the etch rate so that the resulting effect is a uniform etch rate throughout the whole recessed area. In some instances, method 1200 can be similar to method 1000 except that instead of collecting or ignoring the secondary ion signal in block 1022 and 1024, method 1200 either add the pre-distortion value (block 1224) or does not add the pre-distortion value (block 1222).

The foregoing description, for purposes of explanation, used specific nomenclature to provide a thorough understanding of the described embodiments. However, it will be apparent to one skilled in the art that the specific details are not required in order to practice the described embodiments. For example, while several specific embodiments of the disclosure described above used a semiconductor wafer as the sample, the disclosure is not limited to samples that are semiconductor wafers and can be used to mill other types of samples where multiple alternating layers of different materials are formed on or over the samples. Also, while the example FIB system depicted in FIG. 1 includes a single FIB column, in other embodiments an evaluation system can include an SEM column and/or an optical microscope in system 100 in addition to the FIB column 110. Also, while various examples of the disclosure discussed above include sets of alternating layers where the layers alternate between a first layer and a second layer, embodiments of the disclosure are not just two alternating layers. For example, in some embodiments a set of alternating layers may include first, second and third layers where each layer generates a different number of secondary electrons when milled and other embodiments can include any appropriate number of different alternating layers.

Thus, the foregoing descriptions of the specific embodiments described herein are presented for purposes of illustration and description. They are not intended to be exhaustive or to limit the embodiments to the precise forms disclosed. Also, while different embodiments of the disclosure were disclosed above, the specific details of particular embodiments may be combined in any suitable manner without departing from the spirit and scope of embodiments of the disclosure. Further, it will be apparent to one of ordinary skill in the art that many modifications and variations are possible in view of the above teachings.

To the extent the illustrated embodiments of the present disclosure can be implemented using electronic components and circuits known to those skilled in the art, details of such are not explained in any greater extent than that considered necessary as illustrated above for the understanding and appreciation of the underlying concepts of the present disclosure and in order not to obfuscate or distract from the teachings of the present disclosure.

What is claimed is:

1. A method of evaluating a region of a sample that includes a plurality of alternating layers of different material stacked upon each other, the method comprising:
    milling, with a focused ion beam, an area of the sample that includes the alternating layers of different material that generate different numbers of secondary electrons when milled;
    detecting secondary electrons generated during the milling with a detector and outputting a signal representing the detected secondary electrons;
    reducing the milling area; and
    iteratively repeating the milling, detecting and reducing steps multiple times during the evaluating until an endpoint is identified based on the signal output by the detector.

2. The method of evaluating a region of a sample according to claim 1 wherein reducing the milling area is done by a pre-defined milling recipe defined in advance of the milling.

3. The method of evaluating a region of a sample according to claim 2 wherein reducing the milling area includes reducing the milling area after every iteration of the milling.

4. The method of evaluating a region of a sample according to claim 2 wherein the milling recipe includes a plurality of iterations and reduces the milling area in some of the plurality of iterations and does not reduce the milling area in others of the plurality of iterations.

5. The method of evaluating a region of a sample according to claim 1 wherein reducing the milling area is done adaptively by feedback from a signal-to-noise ratio of the signal representing the detected secondary electrons generated during the milling.

6. The method of evaluating a region of a sample according to claim 1 wherein the alternating layers of different material comprise at least first, second and third layers each of which generate different numbers of secondary electrons when milled.

7. The method of evaluating a region of a sample according to claim 1 wherein the sample includes at least ten sets of alternating layers and the milling is an iterative process in which the focused ion beam is repeatedly scanned across the portion of the sample milling a recess through each of the ten sets of alternating layers.

8. The method of evaluating a region of a sample according to claim 1 wherein the sample is a semiconductor wafer.

9. The method of evaluating a region of a sample according to claim 8 wherein the multiple alternating layers are part of a 3D-NAND flash memory structure.

10. The method of evaluating a region of a sample according to claim 1 wherein a sidewall profile of a recess formed by the milling is angled inward and generally smooth from a top portion of the recess to a bottom of the recess.

11. The method of evaluating a region of a sample according to claim 1 wherein a sidewall profile of a recess formed by the milling includes multiple steps from a top portion of the recess to a bottom of the recess that is smaller than the top portion.

12. A system for evaluating a region of a sample that includes alternating layers of different material, the system comprising:
    a vacuum chamber;
    a sample support configured to hold the sample within the vacuum chamber during a sample evaluation process;
    a focused ion beam (FIB) column configured to direct a charged particle beam into the vacuum chamber;
    a processor and a memory coupled to the processor, the memory including a plurality of computer-readable instructions that, when executed by the processor, cause the system to:
    mill, with a focused ion beam, an area of the sample that includes the alternating layers of different material that generate different numbers of secondary electrons when milled;
    detect secondary electrons generated during the milling with a detector and output a signal representing the detected secondary electrons;
    reduce the milling area; and
    iteratively repeat the milling, detecting and reducing steps multiple times during the evaluating process until an endpoint of the process is identified based on the signal.

13. A method of evaluating a region of a sample that includes a plurality of alternating layers of different material stacked upon each other, the method comprising:
    milling, with a focused ion beam, a portion of the sample that includes the alternating layers of different material, wherein the milling is an iterative process in which the focused ion beam is repeatedly scanned across the portion of the sample thereby milling a recess into a depth of the sample, and
    wherein as the milling proceeds a central sub-region of the portion of the sample remains generally flat while a region surrounding the central sub-region is non-planar;
    during the milling, measuring and integrating secondary electron data generated by a detector when the focused ion beam is scanned over the generally flat central sub-region of the portion of the sample while ignoring secondary electron data collected by the detector when the focused ion beam is scanned over the non-planar region of the portion of the sample outside the central sub-region; and
    endpointing the milling based on the secondary electron data collected by the detector.

14. The method of evaluating a region of a sample according to claim 13 wherein a geometry of the sub-region is determined in advance of the milling.

15. The method of evaluating a region of a sample according to claim 13 wherein the sub-region is gradually decreased in size over multiple iterations of the milling according to a predetermined formula.

16. The method of evaluating a region of a sample according to claim 13 wherein the sub-region is gradually decreased in size over multiple iterations of the milling in response to the data generated by the detector to maintain a signal-to-noise ratio of the data generated by the detector within a predetermined range.

17. The method of evaluating a region of a sample according to claim 13 wherein, during the milling, secondary electrons from the alternating layers of different material are collected and used to determine an endpoint for the milling.

18. The method of evaluating a region of a sample according to claim 13 wherein the sample is a semiconductor wafer, the alternating layers of different material comprise at least three sets of alternating first and second layers that generate different numbers of secondary electrons when milled, and the milling can be an iterative process in which the focused ion beam is repeatedly scanned across the portion of the sample thereby milling the recess through each of the ten sets of alternating layers.

* * * * *